United States Patent [19]
Chen

[11] Patent Number: 5,896,080
[45] Date of Patent: Apr. 20, 1999

[54] THERMAL FUSE FOR FIXING ON A CIRCUIT BOARD

[75] Inventor: Jung-Chang Chen, Nan-Tou Hsien, Taiwan

[73] Assignee: Kun-Ming Tsai, Nan-Tou Hsien, Taiwan

[21] Appl. No.: 09/058,035

[22] Filed: Apr. 10, 1998

[51] Int. Cl.⁶ ............................ H01H 37/76; H01H 85/36
[52] U.S. Cl. ................ 337/407; 337/401; 337/405
[58] Field of Search .................................. 337/166, 227, 337/296, 297, 291, 401–407

[56] References Cited

U.S. PATENT DOCUMENTS

| 645,599 | 3/1900 | Law | 337/404 |
| 4,433,231 | 2/1984 | Balchunas | 219/253 |
| 5,280,262 | 1/1994 | Fischer | 337/405 |
| 5,358,798 | 10/1994 | Kleinert, III et al. | 429/7 |
| 5,612,662 | 3/1997 | Dremeier et al. | 337/389 |

*Primary Examiner*—Leo P. Picard
*Assistant Examiner*—Anatoly Vortman
*Attorney, Agent, or Firm*—Limbach & Limbach LLP

[57] ABSTRACT

A thermal fuse includes a resilient coil portion with a turn of at least 360°. Two spring arms have two upper portions connected to and integrally formed with two ends of the coil portion, and two lower portions extending from the upper portions and formed with two contact locations for connection to two circuit contacts of the circuit board. At least one of the contact locations is to be soldered on the circuit board. During the connection of the contact locations to the circuit contacts, the lower portions are kept in a tensed state by moving the contact locations toward each other so as to generate a biasing force to bias the lower portions away from each other.

5 Claims, 5 Drawing Sheets

THERMAL FUSE FOR FIXING ON A CIRCUIT BOARD

BACKGROUND OF THE INVENTION

1. Field of the Invention

This invention relates to a thermal fuse for fixing on a circuit board, more particularly to a thermal fuse with a resilient coil portion connected to two spring arms for soldering onto contacts of the circuit board.

2. Description of the Related Art

Referring to FIGS. 1 and 2, a thermal fuse disclosed in U.S. Pat. No. 5,600,295 is cut from a spring strip that is bent to form a spring clip 10 which includes two spring arms 11,12 interconnected by an M-shaped bending section 13. The tension-free form of the spring clip 10 shown in FIG. 2 has two solder supports 14,15 to be soldered to the corresponding solder contacts 21,22 (see FIG. 3) of a circuit board. Referring to FIG. 3, pressure is exerted on the bending section 13 from two sides via bending punches A, B so that the spring clip 10 is deformed from the shape indicated by the solid lines 16 to the shape indicated by the broken lines 17. The spring arms 11,12 are thus pre-stressed. When the fuse is triggered in that the solder on the solder contact 21 melts, the spring arm 11 is detached from the circuit board, and the pre-stressed spring arms 11,12 assume their original shape, whereas the bending section 13 remains in the deformed shape, as indicated by the dotted lines 18, thereby protecting the components on the circuit board against damage due to thermal overload.

Alternatively, as shown in FIG. 4, the bending section 13 is deformed in the direction of the arrow C via a bending punch after soldering onto the solder contacts 21,22, so that the pre-stress phase having the shape 17' (indicated in broken lines) arises. When the fuse responses, the solder support 14 moves away from the solder contact 21, and the fuse assumes the shape 18' shown in dotted lines.

However, the fuse made from the spring strip has a relatively large size and is not suited for use on a relatively small circuit board. In addition, there is verdigris formed on the fuse to result in elastic fatigue of the spring clip 10. As such, the spring arm 11 cannot depart from the solder contact 21 rapidly when the solder thereon melts, thereby affecting adversely the efficiency of the fuse.

SUMMARY OF THE INVENTION

The object of the present invention is to provide a thermal fuse suitable for fixing on any circuit board and having a good biasing force after soldering to provide effective protection to components on the circuit board.

According to this invention, a thermal fuse includes a resilient coil portion having a turn of at least 360° and defining a central axis normal to a plane substantially confined by the turn. Two spring arms have two upper portions connected to and integrally formed with two ends of the coil portion, and two lower portions extending from the upper portions in radial directions away from the coil portion. The lower portions are disposed to be straddled to form two contact locations for connection to two circuit contacts of the circuit board. At least one of the contact locations is to be soldered. During the connection of the contact locations to the circuit contacts, the lower portions are kept in a tensed state by moving the contact locations toward each other so as to generate a biasing force to bias the lower portions away from each other.

BRIEF DESCRIPTION OF THE DRAWINGS

Other features and advantages of the present invention will become apparent in the following detailed description of the preferred embodiment of the invention, with reference to the accompanying drawings, in which.

DETAILED DESCRIPTION OF THE PREFERRED EMBODIMENT

Figure 2:
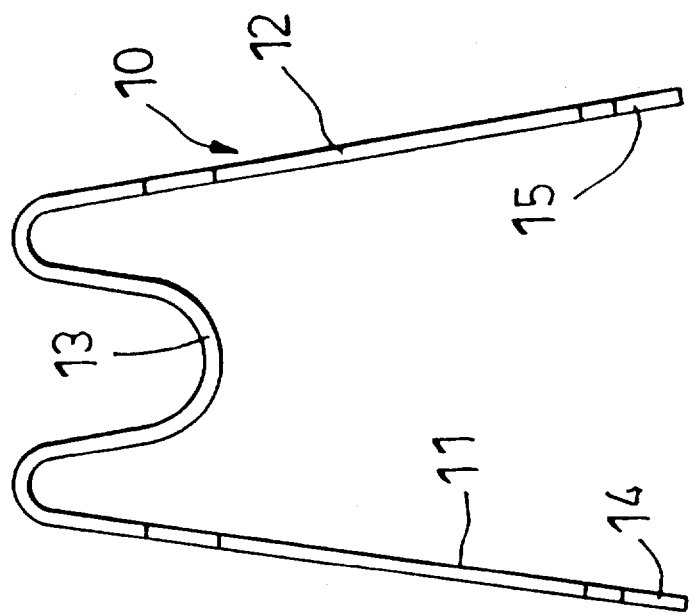
FIG. 2 is a front view of the thermal fuse of FIG. 1.
Figure 1:
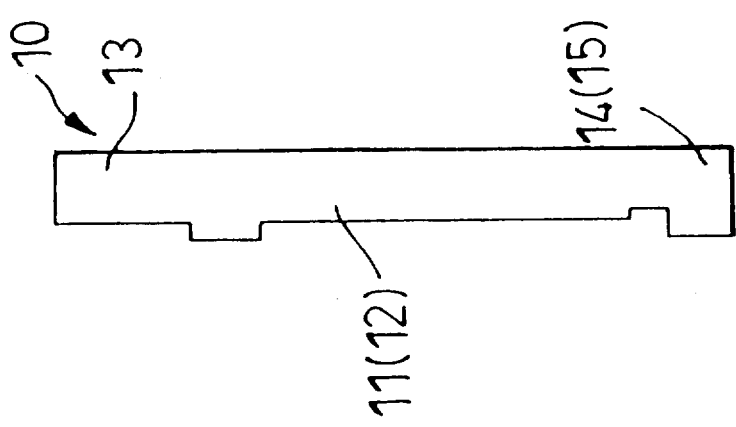
FIG. 1 is a side view of a thermal fuse according to U.S. Pat. No. 5,600,295.
Figure 4:
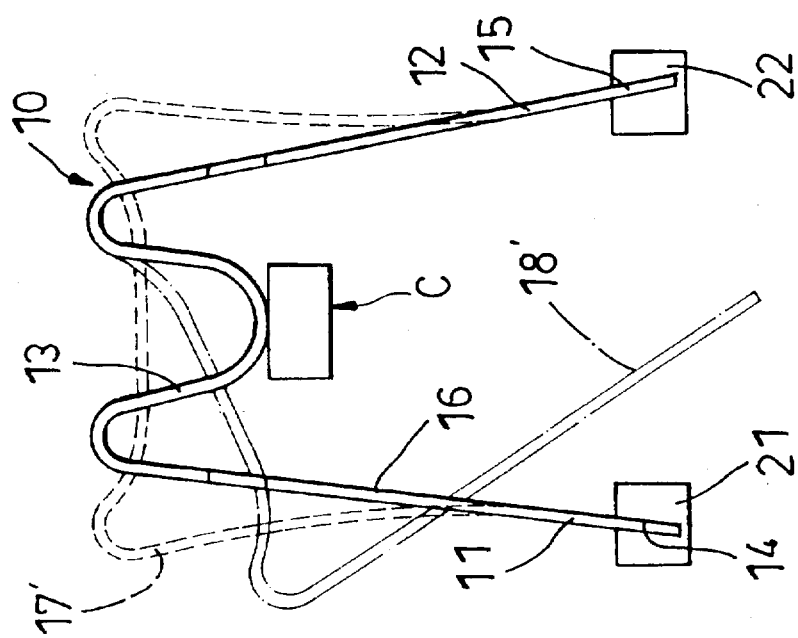
FIG. 4 illustrates the thermal fuse of FIG. 2 in three phrases different from those in FIG. 3.
Figure 3:
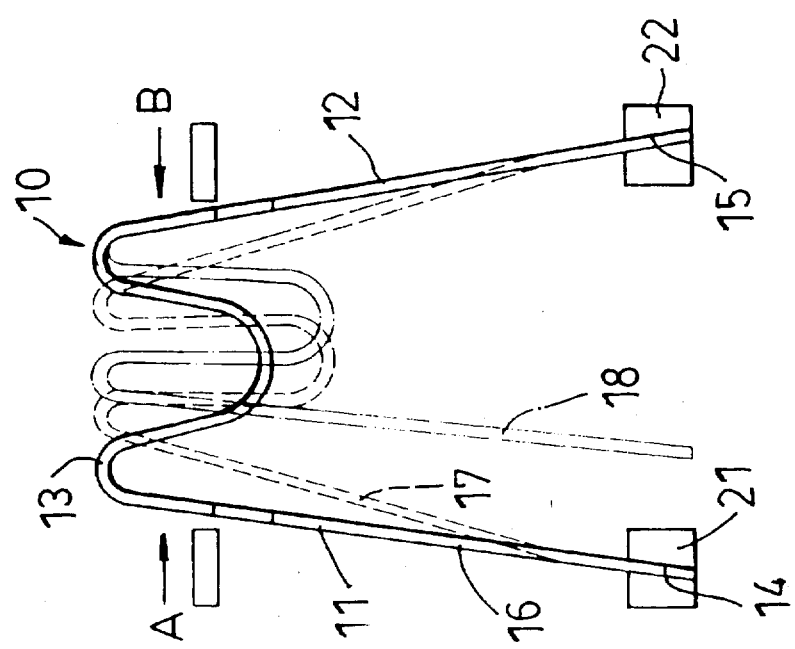
FIG. 3 illustrates the thermal fuse of FIG. 2 in three phrases.
Figure 5:
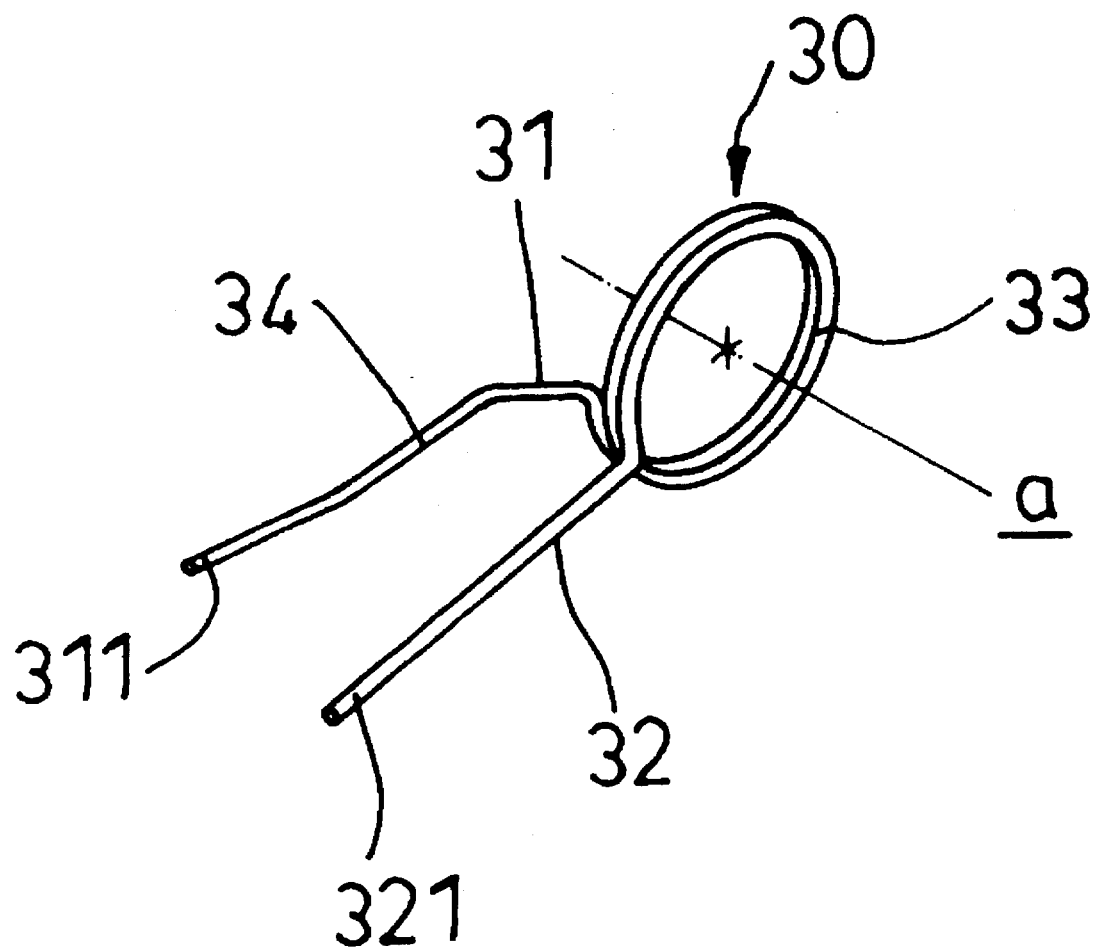
FIG. 5 is a perspective view of a preferred embodiment of a thermal fuse according to this invention.
Figure 6:
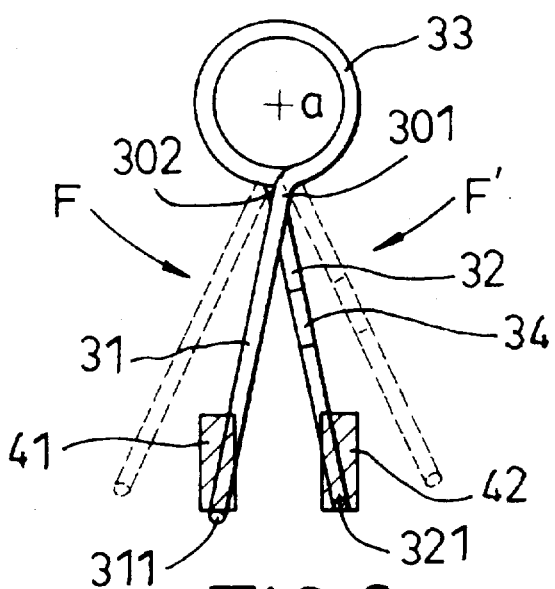
FIG. 6 is a side view of the thermal fuse of the preferred embodiment, illustrating spring arms thereof in tension-free and tensed states.

Referring to FIGS. 5 and 6, the preferred embodiment of a thermal fuse according to the present invention is cut from a metal wire and is bent to include a resilient coil portion 30 and two spring arms 31,32. The thermal fuse is also processed by heat-treatment and surface plating to prevent oxidation or scaling and to assure its metal elasticity.

In this embodiment, the coil portion 30 has a turn 33 of about 720° and defines a central axis (a) normal to a plane substantially confined by the turn 33. The coil portion 30 includes two ends 301,302 that extend respectively in radial outward directions relative to the central axis (a). The spring arms 31,32 have upper portions connected to and integrally formed with the ends 301,302 of the coil portion 30, respectively. Lower portions of the spring arms 31,32 extend respectively from the upper portions in the radial outward directions away from the coil portion 30, and are disposed to be straddled to form two contact locations 311,321. The upper portion of the spring arm 31 (or 32) has a bulged section 34 bent away from the other spring arm 32 (or 31).

Figure 7:
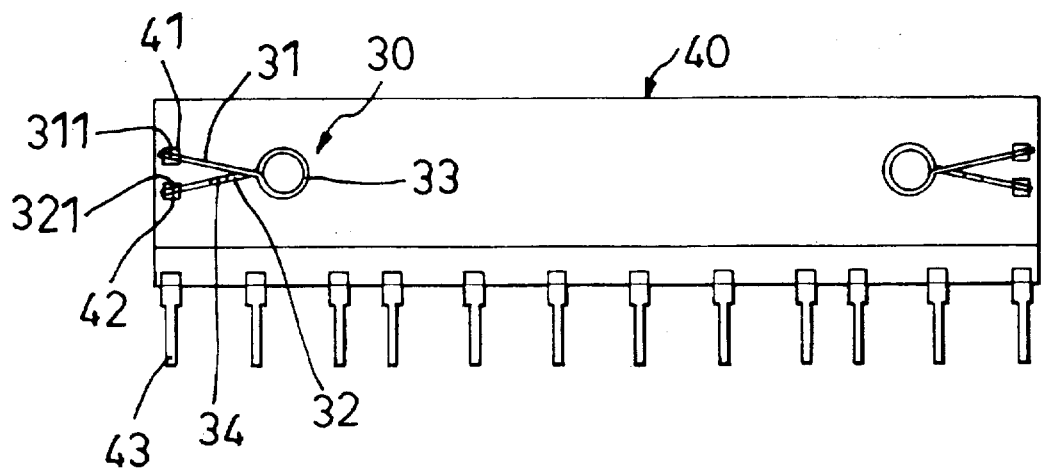
FIG. 7 illustrates the thermal fuse of FIG. 6 after soldering to a circuit board.

The tension-free form of the thermal fuse is shown in dotted lines in FIG. 6. During the connection of the contact locations 311,321 to circuit contacts 41,42 of a circuit board 40 (see FIG. 7), the lower portions of the spring arms 31,32 are kept in a tensed state, as indicated by the solid lines, by moving the contact locations 311,321 toward each other via the application of forces F,F, thereby generating a biasing force to bias the lower portions away from each other. With reference to FIG. 7, the contact locations 311,321 are then soldered to the circuit contacts 41,42 of the circuit board 40, wherein the solder on the circuit contact 41 is less than that on the circuit contact 42 which is connected to pin 43 on the circuit board 40. In addition, the provision of the bulged section 34 on the spring arm 31 prevents the coil portion 30 from being raised relative to the circuit board 40 after soldering.

Figure 8:
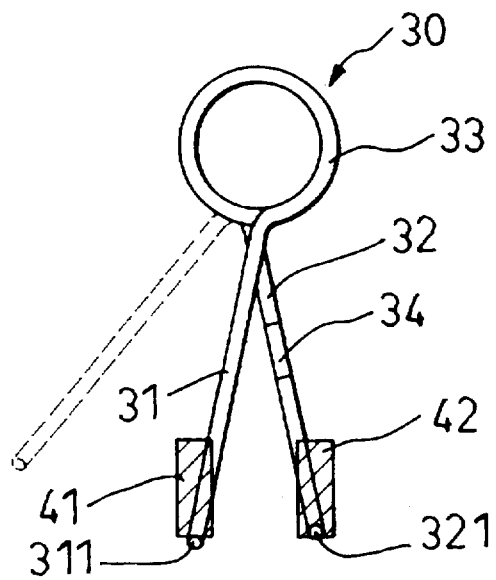
FIG. 8 is a side view illustrating two shapes of the thermal fuse, one in which the spring arms are soldered to the circuit board, the other in which one of the spring arms is detached from the circuit board.
Figure 9:
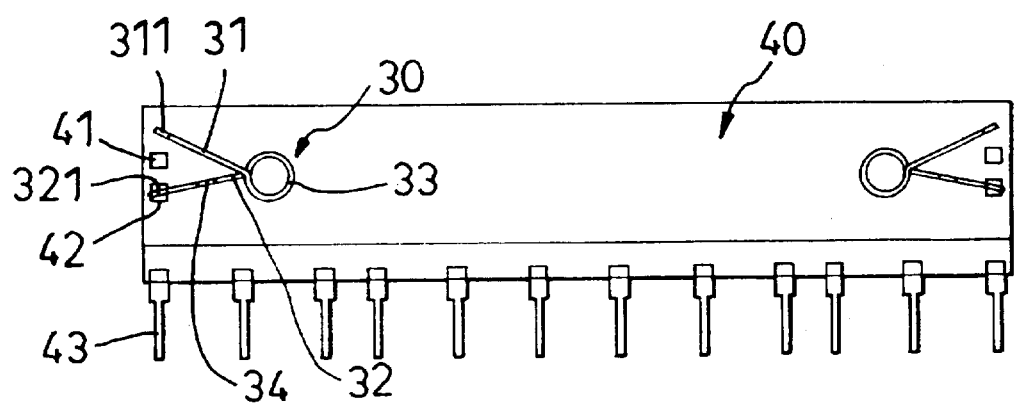
FIG. 9 illustrates the thermal fuse of FIG. 7 with one spring arm thereof detached from the circuit board due to melting of the solder thereon.

Referring to FIGS. 7 and 8, when the fuse is triggered in that the solder of fewer amount on the circuit contact 41 melts, the pre-stressed spring arms 31,32 assume their original shape, indicated by the dotted lines in FIG. 8, so that the spring arm 31 detaches rapidly from the circuit board 40, as shown in FIG. 9.

As compared to the conventional thermal fuse cut from a spring strip, the thermal fuse of this invention is formed from a metal wire and obviates the use of a mold for processing so as to result in a relatively low manufacturing cost. Moreover, by virtue of the coil portion 30, the turn 33 can reinforce the biasing force to bias the spring arms 31,32 away from each other so as to minimize elastic fatigue.

In this embodiment, the spring arm 32 is still welded to the circuit contact 42 when the solder on the spring arm 31 melts, thereby preventing removal of the thermal fuse from the circuit board 40.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

I claim:

1. A thermal fuse for fixing on a circuit board, comprising:

a resilient coil portion having a turn of at least 360° and defining a central axis normal to a plane substantially confined by said turn, said resilient coil portion including two ends that extend respectively in radial outward directions relative to said central axis; and two spring arms having two upper portions connected to and integrally formed with said two ends, respectively, and two lower portions extending respectively from said two upper portions in said radial outward directions away from said coil portion, said lower portions being disposed to be straddled to form two contact locations adapted for connection to corresponding two circuit contacts of the circuit board, wherein at least one of said contact locations is adapted to be soldered on the circuit board, and during the connection of said contact locations to the circuit contacts, said lower portions are kept in a tensed state by moving said contact locations toward each other so as to generate a biasing force to bias said lower portions away from each other, wherein one of said upper portions of said spring arms has a bulged section bent away from the other one of said upper portions.

2. The thermal fuse as claimed in claim 1, wherein said fuse is cut and bent from a metal wire.

3. The thermal fuse as claimed in claim 1, wherein said turn of said coil portion is at least 720°.

4. The thermal fuse as claimed in claim 1, wherein said two contact locations are adapted to be soldered to the circuit contacts.

5. The thermal fuse as claimed in claim 1, wherein said contact locations have different amounts of solder thereon.

* * * * *